United States Patent
Yui (10) Patent No.: US 8,330,266 B2
(45) Date of Patent: Dec. 11, 2012

(54) SEMICONDUCTOR DEVICE

(75) Inventor: Takashi Yui, Shiga (JP)

(73) Assignee: Panasonic Corporation, Osaka (JP)

( * ) Notice: Subject to any disclaimer, the term of this patent is extended or adjusted under 35 U.S.C. 154(b) by 489 days.

(21) Appl. No.: 12/721,067

(22) Filed: Mar. 10, 2010

(65) Prior Publication Data

US 2010/0230801 A1 Sep. 16, 2010

(30) Foreign Application Priority Data

Mar. 10, 2009 (JP) ................. 2009-056485

(51) Int. Cl.
*H01L 23/52* (2006.01)

(52) U.S. Cl. ............. 257/692; 257/723; 257/E23.141

(58) Field of Classification Search ............ 257/686, 257/692, 723, 734, 777
See application file for complete search history.

(56) References Cited

U.S. PATENT DOCUMENTS

| | | | |
|---|---|---|---|
| 4,022,405 A | 5/1977 | Peterson | |
| 4,086,657 A | 4/1978 | Gaskill, Jr. et al. | |
| 7,956,449 B2 * | 6/2011 | Lee et al. | 257/686 |
| 2004/0238948 A1 | 12/2004 | Shiozawa et al. | |
| 2009/0243065 A1 | 10/2009 | Sugino et al. | |
| 2010/0176507 A1 * | 7/2010 | Shiv et al. | 257/698 |

\* cited by examiner

*Primary Examiner* — Roy Potter
(74) *Attorney, Agent, or Firm* — McDermott Will & Emery LLP (57) ABSTRACT

A semiconductor device includes: a first semiconductor device including an interconnect substrate having a cavity structure and a semiconductor element mounted on a bottom part of the cavity structure; and a second semiconductor device provided on and connected to the first semiconductor device via connection terminals. A sealing material is provided between the first semiconductor device and the second semiconductor device. A sloped portion is formed, at a corner portion at which the bottom part and a side wall of the cavity structure in the first semiconductor device meets, to be sloped toward a center part of the cavity structure and have a tapered shape which becomes continuously wider in the direction from an upper part to a lower part.

11 Claims, 9 Drawing Sheets

SEMICONDUCTOR DEVICE

CROSS-REFERENCE TO RELATED APPLICATION

This application claims priority to Japanese Patent Application No. 2009-056485 filed on Mar. 10, 2009, the disclosure of which including the specification, the drawings, and the claims is hereby incorporated by reference in its entirety.

BACKGROUND

The present disclosure relates to a structure including a plurality of stacked semiconductor devices, and each of the semiconductor devices of the structure.

In recent years, with the increasing miniaturization of electronic devices, it is strongly desirable to reduce the size of semiconductor devices loaded or mounted thereon and to increase the density of such semiconductor devices. Accordingly, a recent trend is to use a package called a ball grid array (BGA) in which external terminals are arranged in a lattice pattern on an entire lower surface of a semiconductor device, or to use a package called a chip size package (CSP) in which external terminals are arranged with smaller pitch than that in BGA and which has a smaller size than that of BGA.

Meanwhile, in recent years, to further reduce the size of semiconductor devices and increase the density thereof, a stacked package having a structure in which the above-described CSPs are stacked is used in many cases. Such stacked packages are generally called package on package (PoP), and becoming to be used as a major method of achieving high-density packaging. In stacked packages, an electrode is provided on an upper surface of a lower package, and thus, stacking packages is allowed. Therefore, various configurations based on the known package configurations have been devised.

For example, a configuration (see, for example, U.S. Pat. No. 4,086,657) in which a semiconductor element is mounted by a flip chip process and staking packages is allowed by taking advantage of the feature of the configuration employing flip chip packaging that the height of each package is small, and a configuration (see, for example, U.S. Pat. No. 4,022,405) in which a connection height between packages is made as small as possible to allow stacking packages using a flip chip structure and a cavity structure have been proposed.

SUMMARY

Incidentally, according to the recent industry trend, in the above-described known package configuration, the package height is small and the pitch and size of terminals are both reduced because an increased number of terminals are provided at a connection portion between packages. Accordingly, the problem of connection reliability and other problems arise, as described below.

Specifically, to provide connection between stacked packages, solder balls each having a diameter of 300 µm provided with a terminal pitch of 0.65 mm are currently used in general. In this case, a stand-off of an upper package in stacking packages is reduced due to fusion and deformation, and thus, the minimum stand-off is about 230 µm.

However, it is expected that, with an increasing number of terminals provided at a connection portion between packages, the terminal pitch will be reduced, for example, to 0.50 mm and then 0.40 mm in future. For example, when the terminal pitch is 0.40 mm, solder balls each having a diameter of about 200 µm will be used, and the minimum stand-off in stacking packages is expected to be about 100 µm.

In such conditions, the package configuration described in U.S. Pat. No. 4,086,657 requires reduction in the thickness of a semiconductor chip to an extremely small thickness. Specifically, in order to deal with the expected minimum stand-off, i.e., the stand-off of 100 µm when the terminal pitch is 0.40 mm, the thickness of the semiconductor chip has to be about 50 µm. This is because a clearance of about 20 µm has to be provided between packages so as not to cause the packages to be in contact with each other when the upper and lower packages roll back in stacking them and, as a result, an allowable thickness of the semiconductor chip when a connection height is determined to be 30 µm is 50 µm. In flip chip packaging, in general, after the packages are electrically connected, epoxy resin called an underfill material is injected in a gap at the connection portion to ensure connection reliability. If the connection height is small, an injection performance of epoxy resin is reduced. Therefore, to inject epoxy resin, the connection height has to be about 30 µm. In general, with protruding electrodes for flip chip packaging formed on the semiconductor chip in advance, the thickness of the semiconductor chip is reduced to a predetermined thickness using a grinding wheel or the like. Thus, to reduce the thickness of the semiconductor chip with the protruding electrodes each having a height of 30 µm to a thickness of 50 µm by grinding, it is necessary to grind the semiconductor chip to eliminate a level difference corresponding to 60% or more of the thickness of the ground semiconductor chip. However, this process is technically difficult, and is practically not possible because the semiconductor chip is broken during the process. In general, the thickness of the ground semiconductor chip including the protruding electrodes which can be easily obtained is currently about 4 times the height of the protruding electrodes, and therefore, the thickness of the semiconductor chip including the protruding electrodes with a height of 30 µm is 120 µm.

Therefore, in the package configuration of U.S. Pat. No. 4,086,657, for the thickness of the semiconductor chip and the connection height, the technological limits today are 120 µm and 30 µm, respectively. Thus, in the present technique, where solder balls each having a diameter of 300 µm provided with a terminal pitch of 0.65 mm are used and the minimum stand-off is about 230 µm, 150 µm is an allowable total height of the stacked packages, which does not cause any problem in providing connection between the stacked packages in terms of clearance in stacking packages. However, if a terminal pitch of 0.40 mm, which is expected to become mainstream in future, is used, solder balls each having a diameter of about 200 µm will be used and the minimum stand-off in stacking packages will be about 100 µm. In such a configuration, packages cannot be stacked using only the present technique.

In U.S. Pat. No. 4,022,405, since a substrate having a cavity structure is used, problems in terms clearance between packages do not arise and, accordingly, the above-described problems of U.S. Pat. No. 4,086,657 are not caused. However, some other problem is more likely to arise, as described below.

As described above, the size of terminals at the connection portion is reduced because an increased number of terminals are provided between the upper and lower packages. If only normal terminal connection is provided therebetween, sufficient strength cannot be achieved at the connection portion, and thus, an increasing concern that the semiconductor device is broken due to drop impact, thermal history, and the like arises. In this point, in the packaging configuration of U.S. Pat. No. 4,022,405, no measure is taken for a bottom part of a cavity, so that the generation of a material unfilled area with an underfill material and air inclusion easily occur when underfill injection is performed. For this reason, it is difficult to actually inject an underfill material between packages in a stable manner.

In view of the above-described points, the present disclosure provides a semiconductor device having a stacked package structure which is not dependent on the thickness of a semiconductor chip, and a semiconductor device having a stacked package structure which allows stable injection of an underfill material.

To achieve the above-described object, an example semiconductor device according to the present invention will be described hereinafter.

An example semiconductor device includes: a first semiconductor device including an interconnect substrate having a cavity structure and a semiconductor element mounted on a bottom part of the cavity structure; and a second semiconductor device provided on and connected to the first semiconductor device via connection terminals. In the example semiconductor device, a sealing material is provided between the first semiconductor device and the second semiconductor device, and a sloped portion is formed, at a corner portion at which the bottom part and a side wall of the cavity structure in the first semiconductor device meets, to be sloped toward a center part of the cavity structure and have a tapered shape which becomes continuously wider in the direction from an upper part to a lower part.

In the example semiconductor device, the sloped portion may be made of resin.

In the example semiconductor device, the sloped portion may be made of a material of which the interconnect substrate is formed.

In this case, the sloped portion may be provided integrally with the interconnect substrate.

In the example semiconductor device, it is preferable that the semiconductor element is mounted on the bottom part of the cavity structure of the interconnect substrate via a connection material, and the connection material is provided to reach the sloped portion.

In the example semiconductor device, it is preferable that the connection material is provided to further reach a side wall of the cavity structure.

In the example semiconductor device, it is preferable that the connection material is provided to further fill an opening part of the cavity structure.

In the example semiconductor device, it is preferable that a different material from the connection material is provided between the connection material and the sloped portion to reach the connection material and the sloped portion.

In the example semiconductor device, it is preferable that the different material from the connection material is provided to further reach a side wall of the cavity structure.

In the example semiconductor device, it is preferable that the different material from the connection material is provided to further fill an opening part of the cavity structure.

In the example semiconductor device, it is preferable that the same structure is provided between each of four sides of the semiconductor element and an associated one of side walls of the cavity structure.

According to the present invention, the above-described example semiconductor device can be obtained, thereby providing a semiconductor device having a highly reliable stacked structure feasible within the scope of the present technology which allows reduction in thickness of semiconductor element along with the future trend in package in which the package height is small and the pitch and size of terminals are both reduced because an increased number of terminals are provided at a connection portion between packages.

DETAILED DESCRIPTION

Example embodiments of the present invention will be described hereinafter with reference to the accompanying drawings. Note that the following embodiments are only for illustrative purposes to clarify technical aspects of the present invention with reference to drawings and detailed description. Those skilled in the art will appreciate preferred embodiments of the present invention and may modify and add variations using the disclosed technique. Such modifications and variations fall within the technical aspects and scope of the invention.

First Example Embodiment

Figure 1:
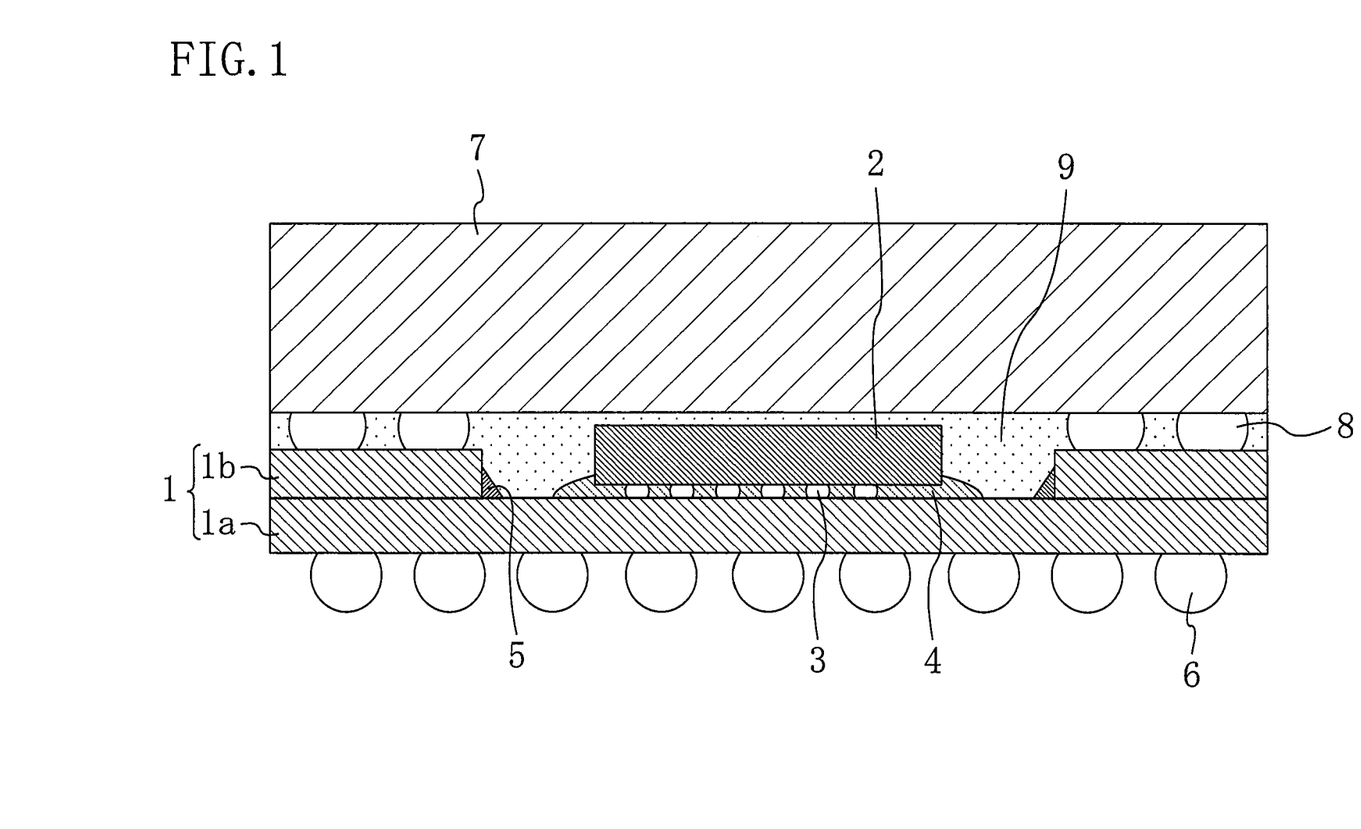
FIG. 1 is a cross-sectional view illustrating a configuration of a semiconductor device according to a first example embodiment of the present invention.

FIG. 1 is a cross-sectional view illustrating a configuration of a semiconductor device according to a first example embodiment of the present invention.

As shown in FIG. 1, a semiconductor device according to this example embodiment includes a lower semiconductor device (first semiconductor device) and an upper semiconductor device (second semiconductor device).

Specifically, the lower semiconductor device includes: solder balls 6 provided on a lower surface thereof; and an interconnect substrate 1 having a cavity structure and including an interconnect substrate 1a and an interconnect substrate 1b having a frame shape with an opening provided in a center part thereof. The lower semiconductor device further includes a semiconductor element (semiconductor chip) 2 mounted on a center part of an upper surface of the interconnect substrate 1a which is exposed at a bottom part of the cavity structure of the interconnect substrate 1, with a connection material (underfill material) 4 interposed therebetween, and having protruding electrodes 3 on a lower surface of the semiconductor element 2. Furthermore, a sloped portion 5 is formed of a resin at a corner portion, i.e., a bottom part at a side wall of the cavity structure of the interconnect substrate 1 at which an upper surface of the interconnect substrate 1a intersects with a side wall of the interconnect substrate 1b, to be sloped toward a center part of the interconnect substrate 1 at which the semiconductor element 2 is placed and have a tapered shape which becomes continuously wider in the direction from an upper part to a lower part.

The upper semiconductor device includes a body portion 7 including a semiconductor element (not shown) therein and solder balls 8 formed on a lower surface thereof. A gap between the lower semiconductor device and the upper semiconductor device is filled with a sealing material (underfill material) 9.

With the above-described configuration of this example embodiment, stacking of the semiconductor devices is allowed without depending on a stand-off provided by the thickness of the semiconductor element 2 and the solder balls 8 of the upper semiconductor device, by arbitrarily adjusting the depth of an opening in the cavity structure of the interconnect substrate 1.

Also, since the sloped portion 5 having the above-described tapered shape is formed at the corner portion at the bottom part of the cavity structure of the interconnect substrate 1, the sealing material 9 can be injected between the lower semiconductor device and the upper semiconductor device without causing the generation of a material unfilled area and air inclusion.

Second Example Embodiment

Figure 2:
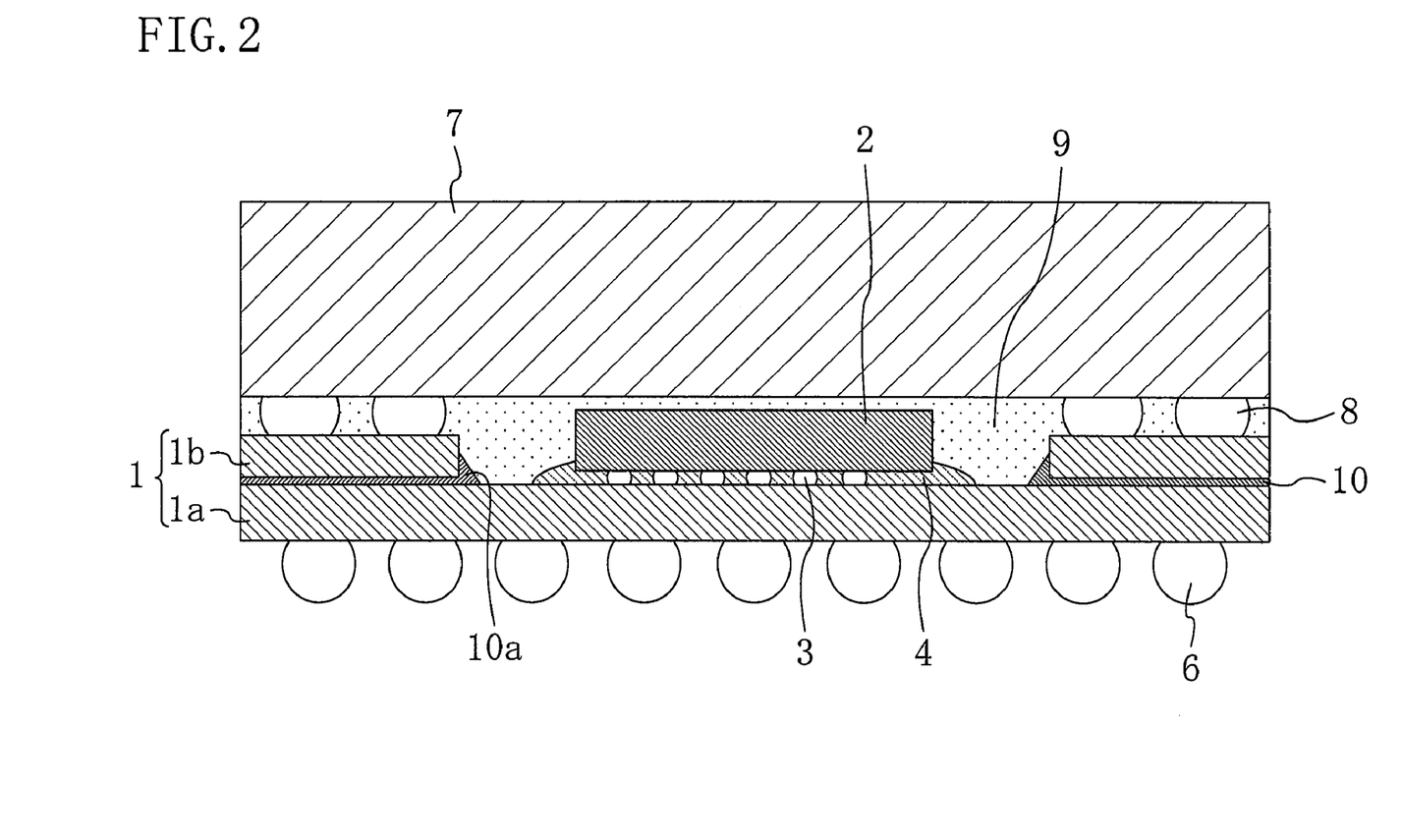
FIG. 2 is a cross-sectional view illustrating a configuration of a semiconductor device according to a second example embodiment of the present invention.

FIG. 2 is a cross-sectional view illustrating a configuration of a semiconductor device according to a second example embodiment of the present invention.

The configuration of the semiconductor device of this example embodiment shown in FIG. 2 is different from the configuration of the semiconductor device of FIG. 1 in that a bonding material 10 is provided between the interconnect substrate 1a and the interconnect substrate 1b and thus a sloped portion 10a similar to the sloped portion 5 of FIG. 1 is made of the bonding material 10. Except this point, the semiconductor device of this example embodiment has the same configuration as that of FIG. 1. The description of each member also shown in FIG. 1 is not repeated.

With the above-described configuration of this example embodiment, the same advantages as those of the semiconductor device of the first example embodiment can be achieved and, as will be described below, the number of process steps of a method for fabricating the semiconductor device can be reduced.

Next, a method for fabricating a semiconductor device according to this example embodiment will be described.

First, two interconnect substrates each of which has a normal structure, not a cavity structure, are prepared. Specifically, one of the interconnect substrates is an interconnect substrate 1a constituting a lower part of the semiconductor device, and the other one of the interconnect substrates is an interconnect substrate 1b, for forming a cavity structure, constituting an upper part of the semiconductor device and having a frame shape. The frame shape of the interconnect substrate 1b is formed by stamping out a metal mold or the like, and can be also referred to as, for example, a picture frame shape.

Next, an interconnect substrate 1 having a cavity structure is formed by bonding the interconnect substrate 1a and the interconnect substrate 1b. In this case, the interconnect substrate 1a and the interconnect substrate 1b are bonded together so that a bonding material sticks out at the inside of the frame of the interconnect substrate 1b. Thus, as described above, a sloped portion 10a is formed of the bonding material at a corner portion at which the upper surface of the interconnect substrate 1a intersects with a side wall of the interconnect substrate 1b, to be sloped toward a center part of the interconnect substrate 1 at which the semiconductor element 2 is placed and have a tapered shape which becomes continuously wider in the direction from an upper part to a lower part.

In subsequent steps, the semiconductor device 2 is connected, via protruding electrodes 3 provided on a lower surface of the semiconductor element 2, to a center part of an upper surface of the interconnect substrate 1a which is exposed at a bottom part of a cavity structure of the interconnect substrate 1 by a flip chip connection method, and then, a connection material 4 is injected between the interconnect substrate 1a and the semiconductor element 2. Furthermore, an upper semiconductor device including a body portion 7 including a semiconductor element (not shown) therein and solder balls 8 formed on a lower surface thereof is mounted on the lower semiconductor device formed in the above-described manner, and then, a sealing material 9 is provided to fill a gap between the lower semiconductor device and the upper semiconductor device.

Although not described in detail in the first example embodiment, the method for fabricating the semiconductor device of FIG. 1 according to the first example embodiment is the same as the fabrication method of this example embodiment, except that the fabrication method of the first example embodiment includes an additional step of forming, after forming the interconnect substrate 1 having a cavity structure, the sloped portion 5 at the corner portion at which the upper surface of the interconnect substrate 1a intersects with a side wall of the interconnect substrate 1b.

According to the fabrication method of this example embodiment, unlike the first example embodiment, the sloped portion 10a can be formed without performing an additional step. Also, since the sloped portion 10a is formed at the corner portion at which the upper surface of the interconnect substrate 1a intersects with the side wall of the interconnect substrate 1b, in the step of filling the sealing material 9 after the forming the sloped portion 10a, the sealing material 9 can be injected without causing the generation of a material unfilled area and air inclusion in the same manner as in the fabrication of the first example embodiment.

Third Example Embodiment

Figure 3:
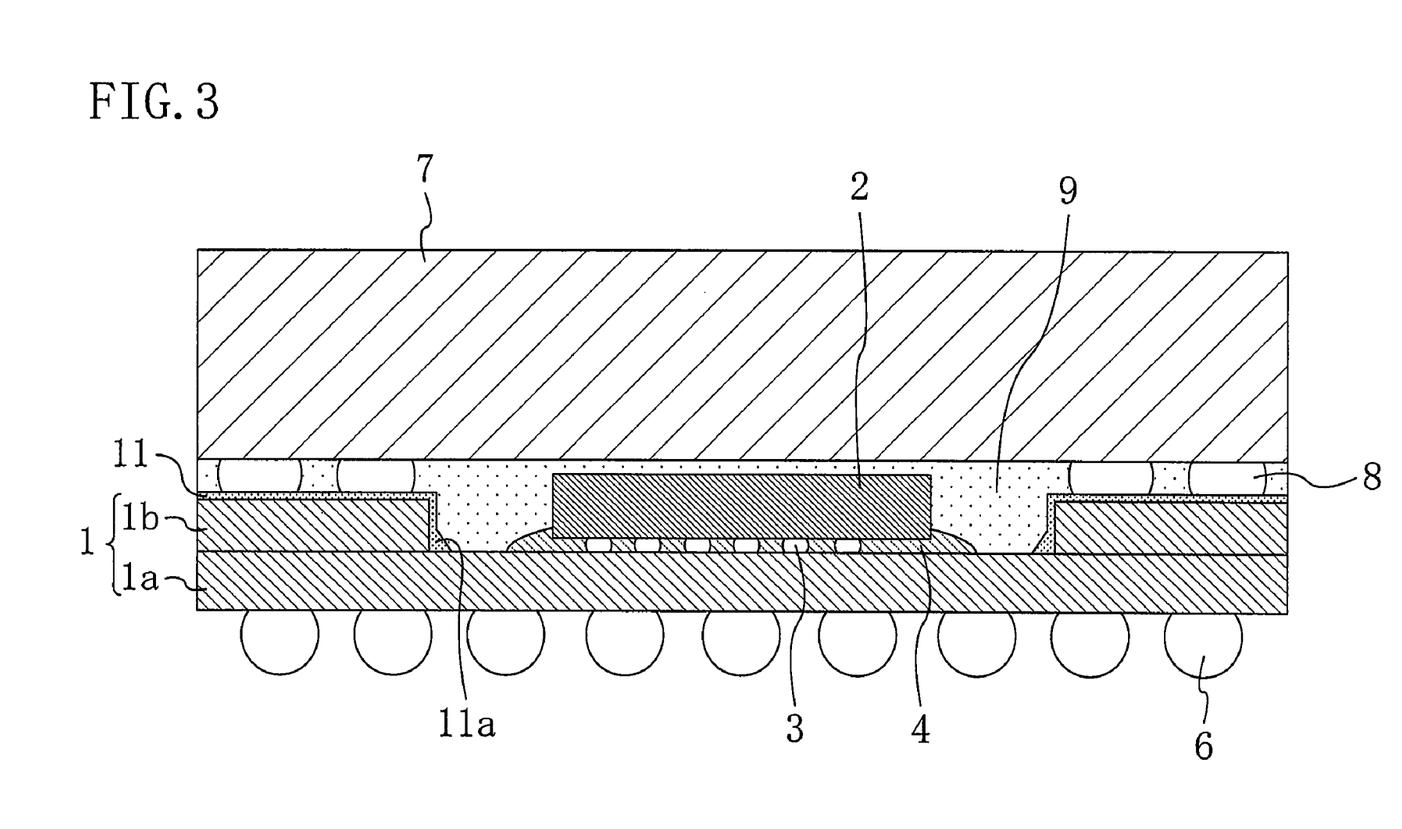
FIG. 3 is a cross-sectional view illustrating a configuration of a semiconductor device according to a third example embodiment of the present invention.

FIG. 3 is a cross-sectional view illustrating a configuration of a semiconductor device according to a third example embodiment of the present invention.

The configuration of the semiconductor device of this example embodiment shown in FIG. 3 is different from the configuration of the semiconductor device of FIG. 1 in that a resist material 11 is applied on the interconnect substrate 1b and thus a sloped portion 11a similar to the sloped portion 5 of FIG. 1 is made of the resist material 11. Except this point, the semiconductor device of this example embodiment has the same configuration as that of FIG. 1. The description of each member also shown in FIG. 1 is not repeated.

With the above-described configuration of this example embodiment, the same advantages as those of the semiconductor device of the first example embodiment can be achieved and, as will be described below, the number of process steps of a method for fabricating the semiconductor device can be reduced.

Next, a method for fabricating a semiconductor device according to this example embodiment will be described.

First, in the same manner as in the steps described in the second example embodiment, an interconnect substrate 1 having a cavity structure and including an interconnect substrate 1a and an interconnect substrate 1b is formed.

Next, a liquid resist material 11 is applied to an upper surface of the interconnect substrate 1b of the interconnect substrate 1. In this case, since the liquid resist material 11 is used, the resist material 11 is collected at the corner portion at which an upper surface of the interconnect substrate 1a intersects with a side wall of the light receiving sections 11b, and thus, a sloped portion 11a is formed of the resist material 11 at the corner portion. Normally, as surface processing, a resist is applied to the interconnect substrate 1a used in this type of package. Therefore, in the configuration of this example embodiment, which requires a resist, the liquid resist material 11 is used to cause it to flow from a surface part to a bottom part, and thus, the sloped portion 11a is formed without requiring an additional process step. Subsequent steps are the same as those described in the second example embodiment.

According to the fabrication method of this example embodiment, unlike the first example embodiment, the sloped portion 11a can be formed without performing an additional step. Also, since the sloped portion 11a is formed at the corner portion at which the upper surface of the sloped portion 11a intersects with the side wall of the light receiving sections 11b, in the step of injecting the sealing material 9 after the forming the sloped portion 11a, the sealing material 9 can be injected without causing the generation of a material unfilled area and air inclusion as in the fabrication of the first example embodiment.

Fourth Example Embodiment

Figure 4:
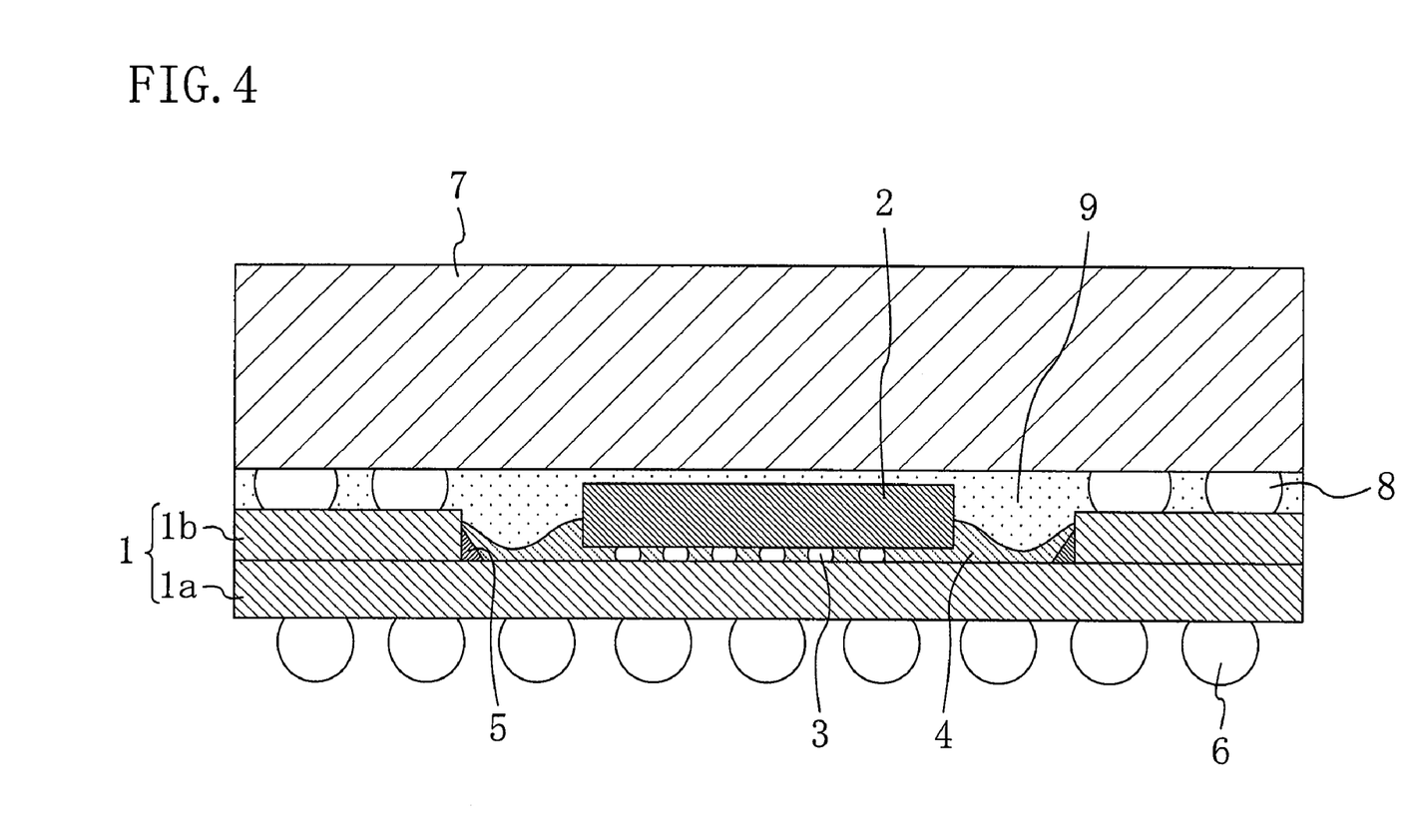
FIG. 4 is a cross-sectional view illustrating a configuration of a semiconductor device according to a fourth example embodiment of the present invention.

FIG. 4 is a cross-sectional view illustrating a configuration of a semiconductor device according to a fourth example embodiment of the present invention.

The configuration of the semiconductor device of this example embodiment shown in FIG. 4 is different from the configuration of the semiconductor device of FIG. 1 in that the connection material 4 injected in a gap between the interconnect substrate 1a and the semiconductor element 2 including the protruding electrodes 3 provided on the lower surface thereof spreads out from the lower surface of the semiconductor element 2 over a bottom part of the cavity structure (i.e., the upper surface of the interconnect substrate 1a) and flows over the sloped portion 5 to reach the side wall of the cavity structure (i.e., the side wall of the interconnect substrate 1b). Except this point, the semiconductor device of this example embodiment has the same configuration as that of FIG. 1. The description of each member also shown in FIG. 1 is not repeated.

With the above-described configuration of this example embodiment, the same advantages as those of the semiconductor device of the first example embodiment can be achieved, and furthermore, a level difference between the sloped portion 5 and each of the upper surface of the interconnect substrate 1a and the side wall of the interconnect substrate 1b is reduced. Therefore, the sealing material 9 is injected while reliably preventing the generation of a material unfilled area and air inclusion.

Next, a method for fabricating a semiconductor device according to this example embodiment will be described.

First, in the same manner as in the steps described in the second example embodiment, an interconnect substrate 1 having a cavity structure and including an interconnect substrate 1a and an interconnect substrate 1b is formed.

Next, a semiconductor device 2 is connected, via protruding electrodes 3 provided on a lower surface of the semiconductor element 2, to a center part of an upper surface of the interconnect substrate 1a which is exposed at a bottom part of a cavity structure of the interconnect substrate 1 by a flip chip connection method. Subsequently, a sufficiently large amount of a connection material 4 is injected between the interconnect substrate 1a and the semiconductor element 2, specifically, into a gap formed by protruding electrodes 3 between the interconnect substrate 1a and the semiconductor element 2. Thus, the connection material 4 spreads out from the lower surface of the semiconductor element 2 over the bottom part of the cavity structure and flows over the sloped portion 5 to reach the side wall of the cavity structure. Subsequent steps are the same as those described in the second example embodiment.

According to the fabrication method of this example embodiment, a level difference between the sloped portion 5 and each of the upper surface of the interconnect substrate 1a and the side wall of the interconnect substrate 1b is reduced, so that the sealing material 9 can be injected while reliably preventing the generation of a material unfilled area and air inclusion.

In this example embodiment, the connection material 4 is provided to spread out from the lower surface of the semiconductor element 2 over the bottom part of the cavity structure to reach the side wall of the cavity structure. Thus, the connection material 4 can perform the same function as that of the sloped portion 5 at the corner portion at which the upper surface of the interconnect substrate 1a intersects with the side wall of the interconnect substrate 1b, so that, even when the sloped portion 5 is not provided in the configuration of this example embodiment, the same advantages as those of the first example embodiment can be achieved.

Fifth Example Embodiment

Figure 5:
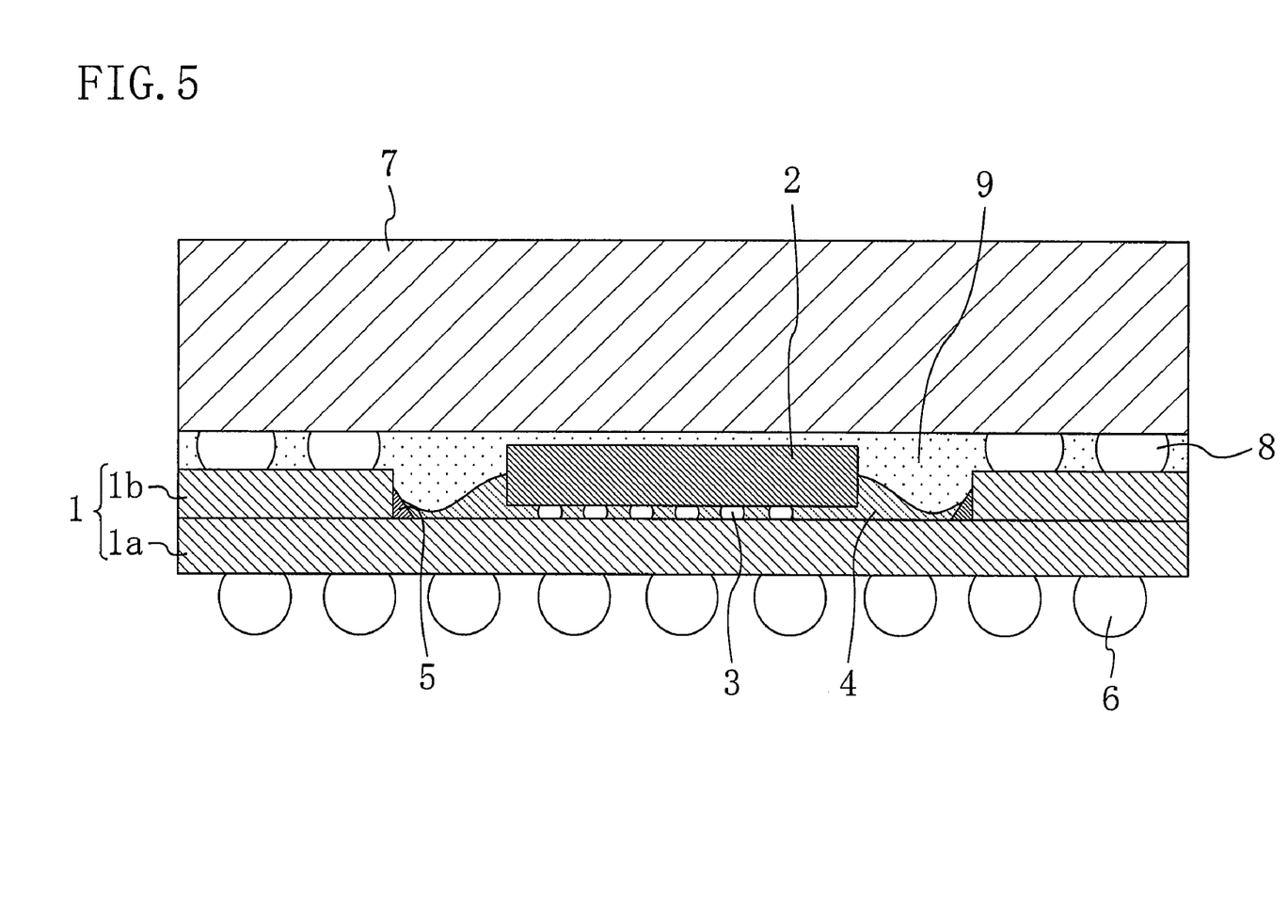
FIG. 5 is a cross-sectional view illustrating a configuration of a semiconductor device according to a fifth example embodiment of the present invention.

FIG. 5 is a cross-sectional view illustrating a configuration of a semiconductor device according to a fifth example embodiment of the present invention.

The configuration of the semiconductor device of this example embodiment shown in FIG. 5 is different from the configuration of the semiconductor device of FIG. 4 in that the connection material 4 injected in a gap between the interconnect substrate 1a and the semiconductor element 2 including the protruding electrodes 3 provided on the lower surface thereof spreads out from the lower surface of the semiconductor element 2 over the bottom part of the cavity structure (i.e., the upper surface of the interconnect substrate 1a) to reach a bottom part of the sloped portion 5 having a tapered shape. Except this point, the semiconductor device of this example embodiment has the same configuration as that of FIG. 4. The description of each member also shown in FIG. 4 is not repeated.

With the above-described configuration of this example embodiment, the same advantages as those of the semiconductor device of the first example embodiment can be achieved, and furthermore, a level difference between the sloped portion 5 and the upper surface of the interconnect substrate 1a is reduced, so that the sealing material 9 is injected while reliably preventing the generation of a material unfilled area and air inclusion. Moreover, unlike the fourth example embodiment, the above-described advantages can be achieved while the amount of the expensive connection material 4 to be used is reduced.

According to the fabrication method of this example embodiment, in the step of injecting the connection material 4 in the method for fabricating the semiconductor device according to the fourth example embodiment, an amount of the connection material 4 with which the connection material 4 reaches the sloped portion 5 may be injected into a gap formed by the protruding electrodes 3 between the interconnect substrate 1a and the semiconductor element 2. Thus, the advantages of the configuration of the fourth example embodiment can be achieved without performing an additional process step. Other steps are the same as those described in the fourth example embodiment.

Sixth Example Embodiment

Figure 6:
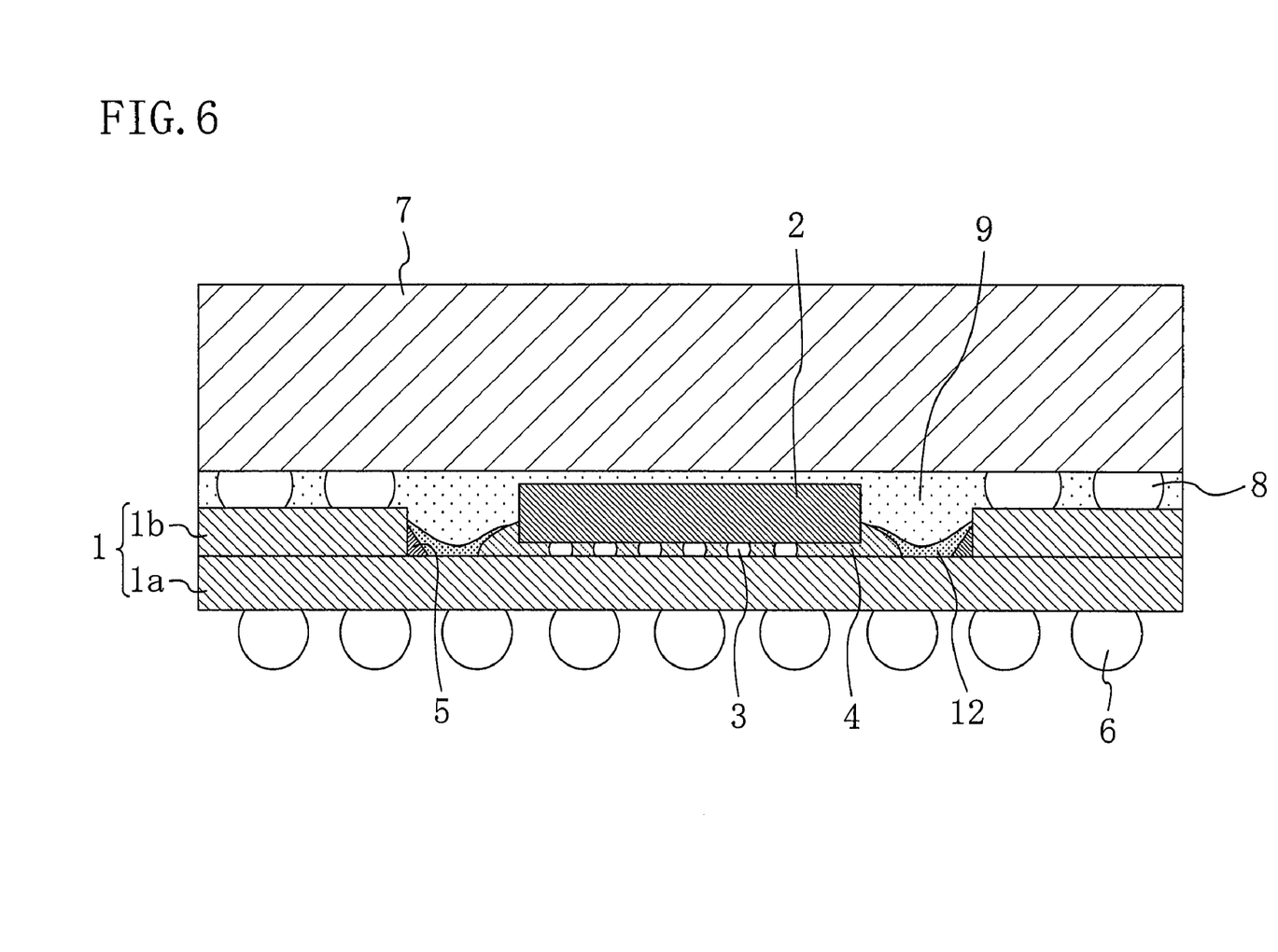
FIG. 6 is a cross-sectional view illustrating a configuration of a semiconductor device according to a sixth example embodiment of the present invention.

FIG. 6 is a cross-sectional view illustrating a configuration of a semiconductor device according to a sixth example embodiment of the present invention.

The configuration of the semiconductor device of this example embodiment shown in FIG. 6 is different from the configuration of the semiconductor device of FIG. 1 in that a resin 12 formed of a different material from a material of the interconnect substrate 1 and the connection material 4 on the interconnect substrate 1b is provided to cover an end part of the connection material 4 injected in the gap between the interconnect substrate 1a and the semiconductor element 2 including the protruding electrodes 3 provided on the lower surface thereof and the sloped portion 5 and to reach the side wall of the cavity structure. Except this point, the semiconductor device of this example embodiment has the same configuration as that of FIG. 1. The description of each member also shown in FIG. 1 is not repeated.

With the above-described configuration of this example embodiment, the same advantages as those of the semiconductor device of the first example embodiment can be achieved, and furthermore, a level difference between the sloped portion 5 and each of the upper surface of the interconnect substrate 1a and the side wall of the interconnect substrate 1b is reduced, so that the sealing material 9 is injected while the generation of a material unfilled area and air inclusion is reliably prevented.

Furthermore, when being heated, the semiconductor device having a configuration employing a flip chip structure is easily rolled due to mismatch of respective thermal expansion coefficients of the material of the interconnect substrate 1 and the connection material 4 of the semiconductor element 2. In general, the connection material 4 has the largest thermal expansion coefficient, and thus, it is assumed that, in the configuration of the fourth example embodiment, high thermal behavior is exhibited and stacking of the upper semiconductor device and the lower semiconductor device is not easy. However, in this example embodiment, the resin 12 is made of a different material from the material of the interconnect substrate 1 and the connection material 4 and, specifically, is made of, for example, a resin having a smaller thermal expansion coefficient than that of the connection material 4. Thus, the generation of a material unfilled area and air inclusion can be reliably prevented while the above-described problem due to thermal behavior is prevented.

In this example embodiment, the resin 12 is provided to cover the end part of the connection material 4 and the sloped portion 5. Thus, the resin 12 can perform the same function as that of the sloped portion 5 at the corner portion at which the upper surface of the interconnect substrate 1a intersects with the side wall of the interconnect substrate 1b, so that, even when the sloped portion 5 is not provided in the configuration of this example embodiment, the same advantages as the above-described advantages of this example embodiment can be achieved. Also, according to the fabrication method of this example embodiment, the step of providing the resin 12 may be performed after the step of injecting the connection material 4 and forming the sloped portion 5, and other steps are the same as those described in the second example embodiment.

Seventh Example Embodiment

Figure 7:
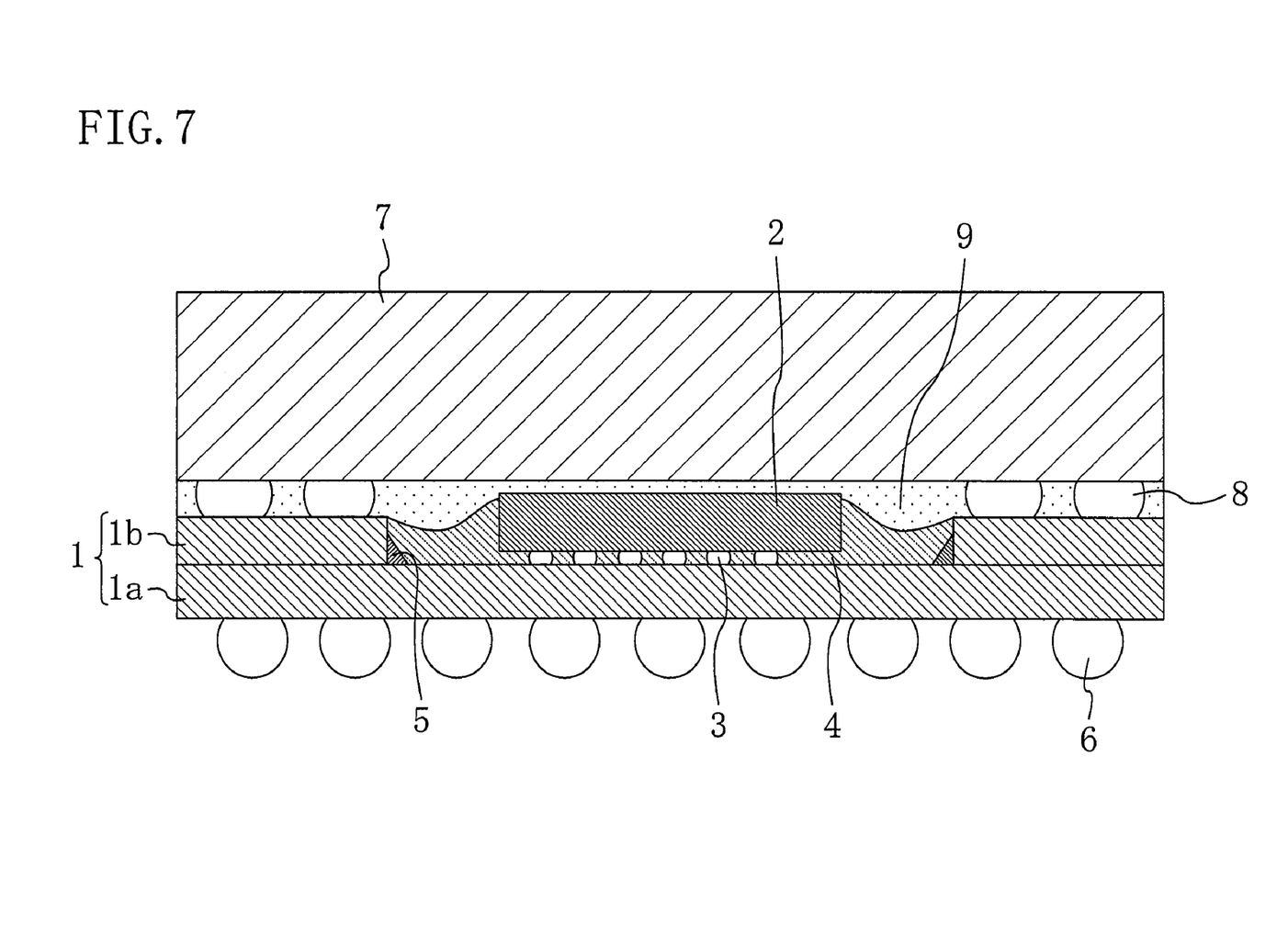
FIG. 7 is a cross-sectional view illustrating a configuration of a semiconductor device according to a seventh example embodiment of the present invention.

FIG. 7 is a cross-sectional view illustrating a configuration of a semiconductor device according to a seventh example embodiment of the present invention.

The configuration of the semiconductor device of this example embodiment shown in FIG. 7 is different from the configuration of the semiconductor device of FIG. 4 in that the connection material 4 injected in a gap between the interconnect substrate 1a and the semiconductor element 2 including the protruding electrodes 3 provided on the lower surface thereof spreads out from the lower surface of the semiconductor element 2 over the bottom part of the cavity structure (i.e., the upper surface of the interconnect substrate 1a), covers the sloped portion 5 and furthermore fills an opening part of the cavity structure. Except this point, the semiconductor device of this example embodiment has the same configuration as that of FIG. 4. The description of each member also shown in of FIG. 4 is not repeated.

With the above-described configuration of this example embodiment, a level difference between the sloped portion 5 and each of the upper surface of the interconnect substrate 1a and the side wall of the interconnect substrate 1b is substantially eliminated by the connection material 4, so that the generation of a material unfilled area and air inclusion are not caused in injecting the sealing material 9.

According to the fabrication method of this example embodiment, for example, an amount obtained by subtracting a volume of the semiconductor element 2 from a volume of an opening part of the cavity structure is determined as an amount of the connection material 4 to be injected between the interconnect substrate 1a and the semiconductor element 2 in the step of injecting the connection material 4 in the method for fabricating the semiconductor device of the fourth example embodiment. Accordingly, the connection material 4 is provided to spread out from the lower surface of the semiconductor element 2 over the bottom part of the cavity structure (i.e., the upper surface of the interconnect substrate 1a), to cover the sloped portion 5 and furthermore to fill the opening part of the cavity structure. Thus, the advantages of the configuration of this example embodiment can be achieved without performing an additional process step. Other steps are the same as those described in the fourth example embodiment.

In this example embodiment, the connection material 4 is provided to fill the opening part of the cavity structure. Thus, even when the sloped portion 5 is not provided in the configuration of this example embodiment, the same advantages as those of this example embodiment can be achieved.

Eighth Example Embodiment

Figure 8:
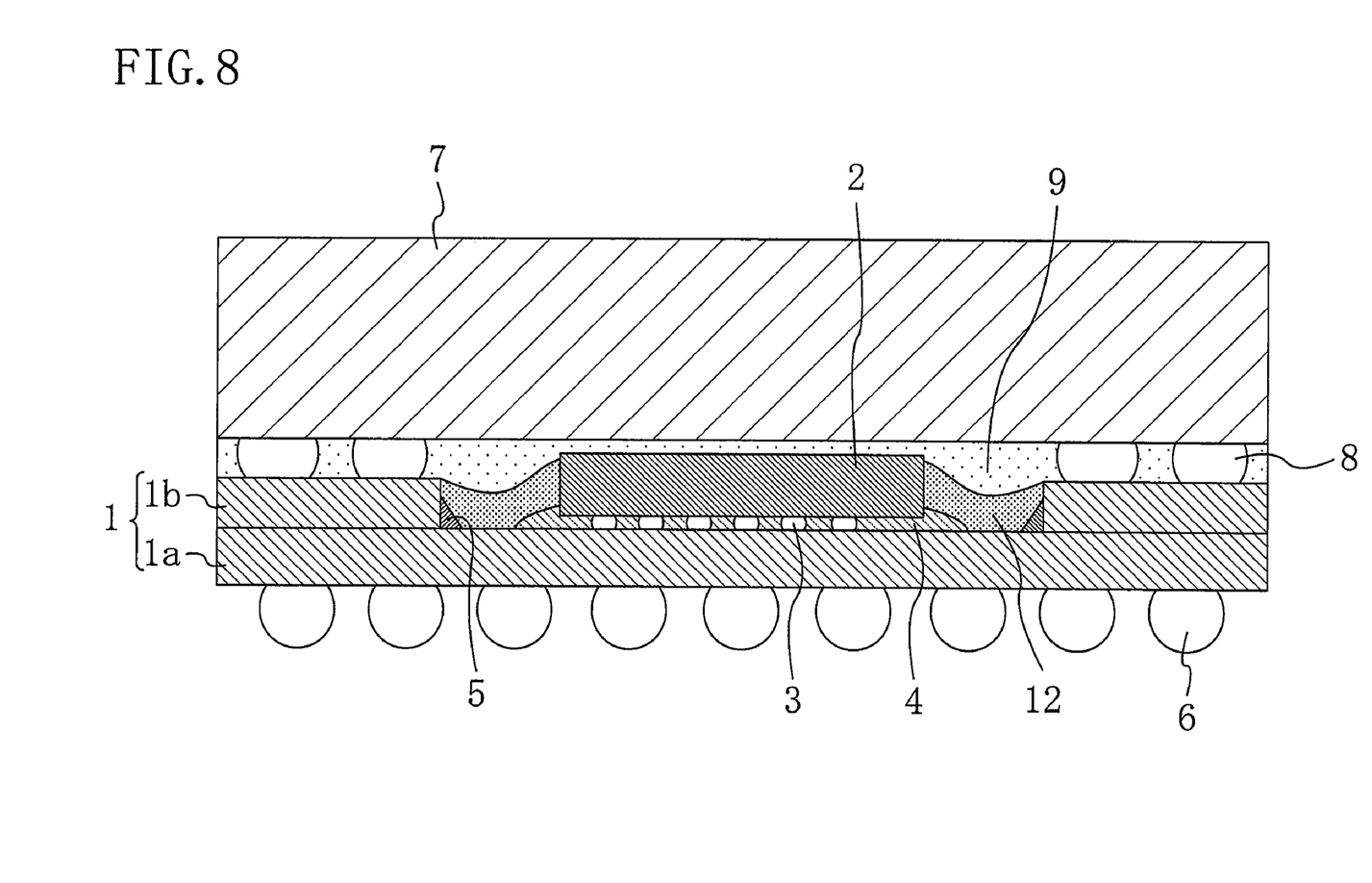
FIG. 8 is a cross-sectional view illustrating a configuration of a semiconductor device according to an eighth example embodiment of the present invention.

FIG. 8 is a cross-sectional view illustrating a configuration of a semiconductor device according to an eighth example embodiment of the present invention.

The configuration of the semiconductor device of this example embodiment shown in FIG. 8 is different from the configuration of the semiconductor device of FIG. 6 in that the resin 12 made of a different material from the material of the interconnect substrate 1 and the connection material 4 on the interconnect substrate 1b is provided to cover the end part of the connection material 4 injected in a gap between the interconnect substrate 1a and the semiconductor element 2 including the protruding electrodes 3 provided on the lower surface thereof, and the sloped portion 5, and furthermore to fill the opening part of the cavity structure. Except this point, the semiconductor device of this example embodiment has the same configuration as that of FIG. 6. The description of each member also shown in of FIG. 6 is not repeated.

With the above-described configuration of this example embodiment, the level difference between the sloped portion 5 and each of the upper surface of the interconnect substrate 1a and the side wall of the interconnect substrate 1b is substantially eliminated by the resin 12 provided to fill the opening part of the cavity structure, so that the generation of a material unfilled area and air inclusion are not caused in injecting the sealing material 9.

Furthermore, as described in the sixth example embodiment, according to this example embodiment, the resin 12 is made of a different material from the material of the interconnect substrate 1 and the connection material 4 and, specifically, is made of, for example, a resin having a smaller thermal expansion coefficient than that of the connection material 4. Thus, the generation of a material unfilled area and air inclusion can be reliably prevented while the above-described problem due to thermal behavior is prevented.

In this example embodiment, the resin 12 is provided to fill the opening part of the cavity structure. Thus, even when the sloped portion 5 is not provided in the configuration of this example embodiment, the same advantages as the above-described advantages of this example embodiment can be achieved. Also, according to the fabrication method of this example embodiment, the step of providing the resin 12 may be performed after the step of injecting the connection material 4 and forming the sloped portion 5, and other steps are the same as those described in the second example embodiment.

Ninth Example Embodiment

Figure 9:
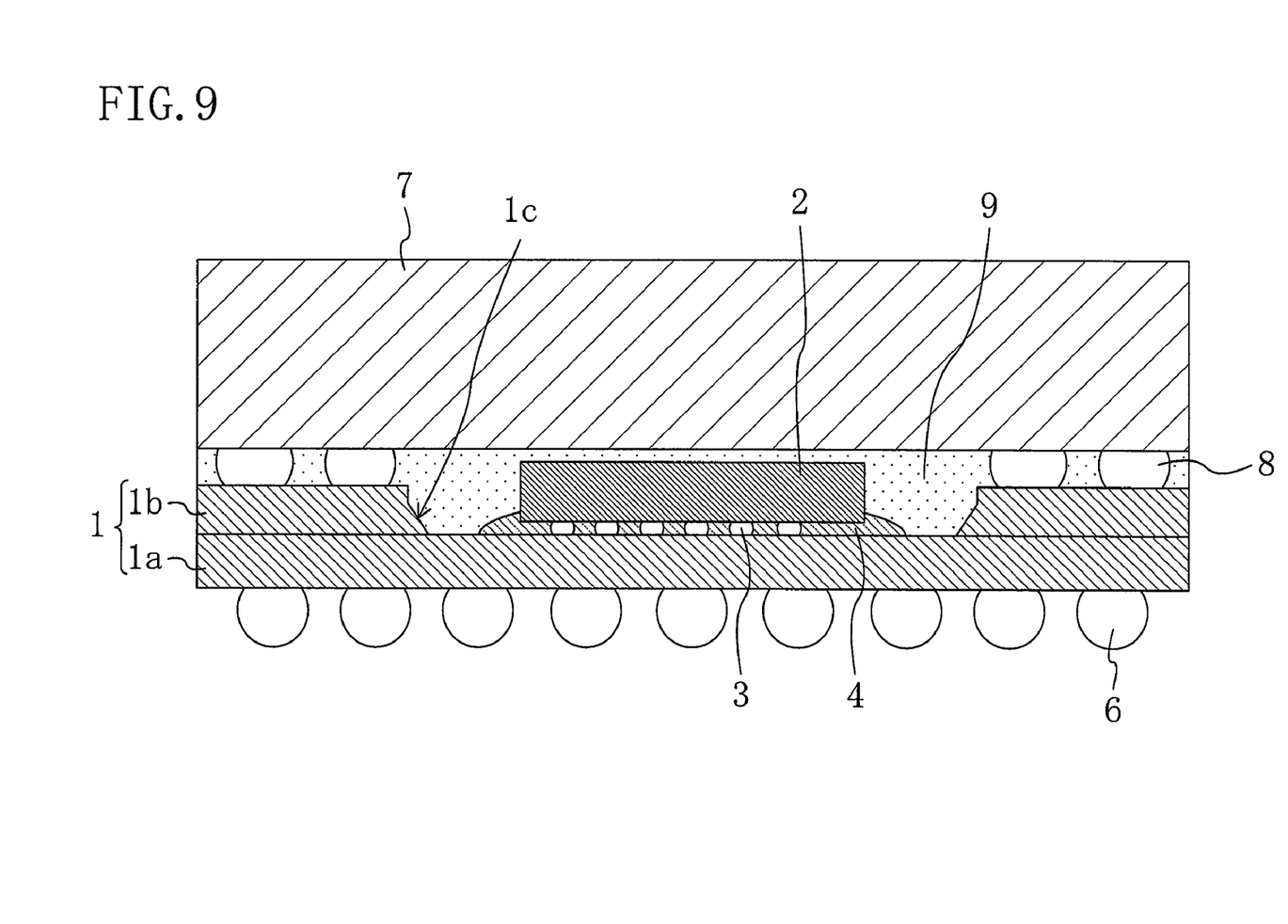
FIG. 9 is a cross-sectional view illustrating a configuration of a semiconductor device according to a ninth example embodiment of the present invention.

FIG. 9 is a cross-sectional view illustrating a configuration of a semiconductor device according to a ninth example embodiment of the present invention.

The configuration of the semiconductor device of this example embodiment shown in FIG. 9 is different from the configuration of the semiconductor device of FIG. 1 in that the sloped portion 5 is formed as a part of the interconnect substrate 1. Except this point, the semiconductor device of this example embodiment has the same configuration as that of FIG. 1. The description of each member also shown in FIG. 1 is not repeated.

Specifically, a sloped portion 1c being sloped toward a center part of the interconnect substrate 1 at which the semiconductor element 2 is placed and having a tapered shape which becomes continuously wider in the direction from an upper part to a lower part is provided integrally with the interconnect substrate 1 at a side wall potion of the interconnect substrate 1b having a frame shape which is exposed at the opening part.

With the above-described configuration of this example embodiment, as described in the first example embodiment, stacking of the semiconductor devices without depending on a stand-off provided by the thickness of the semiconductor element 2 and the solder balls 8 of the upper semiconductor device is allowed by arbitrarily adjusting the depth of the opening in the cavity structure of the interconnect substrate 1.

Also, since the sloped portion 1c having the above-described tapered shape is formed at the corner portion of the bottom part of the cavity structure of the interconnect substrate 1, the sealing material 9 can be injected between the lower semiconductor device and the upper semiconductor device without causing the generation of a material unfilled area and air inclusion.

Clearly, each of the respective configurations of the fourth through eighth example embodiments is applicable to the configuration of this example embodiment.

Also, in each of the first through ninth example embodiments, it can be seen from the drawings that the sloped portion (5, 10a, 11a or 1c) is provided at each of two sides of the opening part of the cavity structure facing each other or part of each of the two sides. However, it is effective and preferable that the slope potion is provided at each of all corner portions of the bottom part with four sides located in the opening part of the cavity structure at which the semiconductor element 2 is placed. The configuration of the semiconductor device according to the present invention is not limited thereto. Clearly, if the sloped portion is provided at a part of any one of the four sides, the above-described advantages can be at least achieved. When the sloped portion is provided at each of all corner portions of the bottom part with four sides located in the opening part of the cavity structure, a method in which an underfill material or filling resin is not dispensed only in one direction but is provided around the semiconductor element 2, or like method can be employed. Again, the present invention is not limited to this method.

The example semiconductor device according to the present invention is useful in reducing the height of packages, and reducing the pitch and the size of the terminals according to increase in number of terminals at a connection portion between packages, which are expected to take place in future.

What is claimed is:

1. A semiconductor device, comprising:
   a first semiconductor device including an interconnect substrate having a cavity structure and a semiconductor element mounted on a bottom part of the cavity structure; and
   a second semiconductor device provided on and connected to the first semiconductor device via connection terminals,
   wherein
   a sealing material is provided between the first semiconductor device and the second semiconductor device, and
   a sloped portion is formed, at a corner portion at which the bottom part and a side wall of the cavity structure in the first semiconductor device meets, to be sloped toward a center part of the cavity structure and have a tapered shape which becomes continuously wider in the direction from an upper part to a lower part.

2. The semiconductor device of claim 1, wherein the sloped portion is made of resin.

3. The semiconductor device of claim 1, wherein the sloped portion is made of a material of which the interconnect substrate is formed.

4. The semiconductor device of claim 3, wherein the sloped portion is provided integrally with the interconnect substrate.

5. The semiconductor device of claim 1, wherein the semiconductor element is mounted on the bottom part of the cavity structure of the interconnect substrate via a connection material, and
the connection material is provided to reach the sloped portion.

6. The semiconductor device of claim 5, wherein the connection material is provided to further reach a side wall of the cavity structure.

7. The semiconductor device of claim 6, wherein the connection material is provided to further fill an opening part of the cavity structure.

8. The semiconductor device of claim 1, wherein a different material from the connection material is provided between the connection material and the sloped portion to reach the connection material and the sloped portion.

9. The semiconductor device of claim 8, wherein the different material from the connection material is provided to further reach a side wall of the cavity structure.

10. The semiconductor device of claim 9, wherein the different material from the connection material is provided to further fill an opening part of the cavity structure.

11. The semiconductor device of claim 1, wherein the same structure is provided between each of four sides of the semiconductor element and an associated one of side walls of the cavity structure.

* * * * *